United States Patent
Golladay

[19]

[11] Patent Number: 5,821,542
[45] Date of Patent: Oct. 13, 1998

[54] PARTICLE BEAM IMAGING SYSTEM HAVING HOLLOW BEAM ILLUMINATION

[75] Inventor: Steven Douglas Golladay, Hopewell Junction, N.Y.

[73] Assignee: International Business Machines Corporation, Armonk, N.Y.

[21] Appl. No.: 670,461

[22] Filed: Jun. 26, 1996

[51] Int. Cl.[6] .................................................... H01J 37/09
[52] U.S. Cl. .................. 250/396 R; 250/398; 250/492.2
[58] Field of Search ......................... 250/396 R, 396 ML, 250/398, 492.2, 492.21, 492.22, 492.23

[56] References Cited

U.S. PATENT DOCUMENTS

| | | | |
|---|---|---|---|
| 3,795,813 | 3/1974 | Kunath | 250/396 R |
| 3,996,468 | 12/1976 | Fletcher et al. | 250/396 R |
| 4,231,811 | 11/1980 | Somekh et al. | 250/492.2 |
| 4,238,680 | 12/1980 | Anger et al. | 250/397 |
| 4,947,413 | 8/1990 | Jewell et al. | 250/492.2 |
| 5,348,837 | 9/1994 | Fukuda et al. | 430/269 |

OTHER PUBLICATIONS

K. D. Cummings, "A study of deposited charge from electron beam lithography", J.Vac.Sci. Technol. B8(6), Nov./Dec. 1990, pp. 1786–1788.

W. Liu, et al., "Resist charging in electron beam lithography", J. Vac. Sci. Technol. B 13(5), Sep./Oct. 1995, pp. 1979–1983.

R. F. Pease, "Resist Charging in Electron Beam Lithography", SRC Technical Report T95068 Contract No. 93–MJ–223, Stanford University, May 1995.

*Primary Examiner*—Kiet T. Nguyen
*Attorney, Agent, or Firm*—Susan M. Murray

[57] ABSTRACT

An charged particle beam imaging system reduces aberrations affecting resolution at the workpiece where the aberrations are caused by interactions between the charged particles in the beam. The average distance between the particles at a crossover image in the illumination subsystem is increased by positioning an annular aperture at the crossover image.

18 Claims, 2 Drawing Sheets

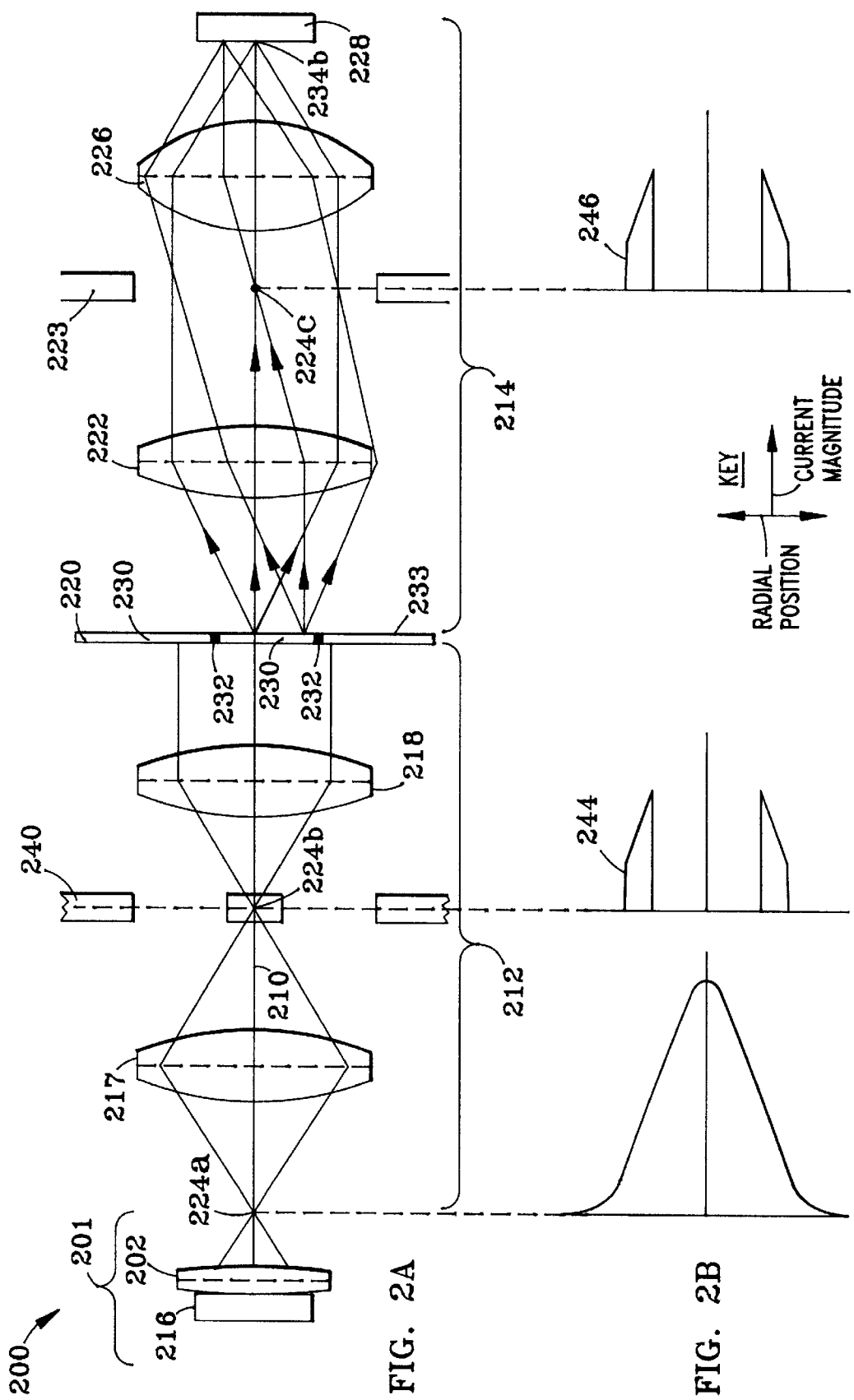

PARTICLE BEAM IMAGING SYSTEM HAVING HOLLOW BEAM ILLUMINATION

FIELD OF THE INVENTION

This invention relates in general to particle beam imaging systems and more specifically to electron-beam projection lithography systems.

BACKGROUND OF THE INVENTION

Lithography systems are used in the manufacture of integrated circuits to expose patterns on a resist layer so that circuit features can be defined on an underlying workpiece by subsequent processing steps which may add or subtract material (e.g. by etching, depositing, doping . . . ). Among the kinds of lithography systems are optical exposure systems and particle beam, for example, electron-beam (e-beam) exposure systems.

Shown in FIG. 1A is an exemplary conventional e-beam projection system 100 for defining features on workpiece 128. Shown in FIG. 1B are beam current distributions (e.g. showing beam current as a function of radial distance from a central axis) at various points along the central axis. With reference to FIG. 1A, the conventional e-beam projection system 100 includes illumination optics 112 and imaging optics 114 disposed about a central axis 110, and separated by a reticle (e.g. mask) 120 disposed normal to the central axis 110.

Included within the illumination optics 112 is an electron gun 101, comprising a cathode 116 and associated beam accelerating and focusing electrode(s) 102 which provides a beam of electrons 113, and which has a crossover point 124*a*. Beam current distribution 142 (FIG. 1B) shows an approximately Gaussian distribution corresponding to gun crossover point 124*a*. Condenser 117 and illuminator 118, together with aperture stop 103, control the angular distribution of the electron beam 113 impinging on reticle 120. More particularly, condenser 117 functions to produce a magnified image 124*b* of gun crossover point 124*a* at the aperture stop 103, and illuminator 118 controls the apparent position of the crossover image 124*b* with respect to the reticle 120. Aperture stop 103 is a circular opening in a solid body, centrally transmissive of electrons. Beam current distribution 144 (FIG. 1B) shows an approximately Gaussian distribution which has been truncated by the aperture stop 103. Thus aperture stop 103 improves system resolution by removing from the beam 113, electrons which arrive at the workpiece 128 at relatively large angles of incidence. Electrons which arrive at the workpiece 128 at relatively large angles of incidence are subject to aberrations which result in poor imaging. Optionally included within the illumination optics 112, but not shown in FIG. 1, are other lenses and apertures to control the size and shape of the beam impinging on the reticle 120.

Reticle 120 has regions 130 and 132 which differ in their electron scattering properties to enable the imaging optics 114 to produce an image with adequate contrast for pattern exposure. For example, regions 130 and 132 may have differing degrees of transmissivity to electrons, but other electron scattering properties may also be exploited by the regions 130 and 132 of reticle 120. The electron beam 113 is scattered by the reticle 120, forming an object image distribution to be manipulated by the imaging optics 114.

Included within the imaging optics 114 may be lens 122 for positioning crossover image 124*c* at contrast aperture 123, and projector 126 for imaging the pattern on reticle 120 to the workpiece 128, demagnified as desired.

E-beam projection systems, such as the one described with reference to FIGS. 1A and 1B, are generally capable of achieving better resolution than conventional optical exposure systems. However, throughput is significantly lower for e-beam exposure systems than for photoexposure systems, thus making e-beam tools too costly for general production.

Higher throughput in e-beam lithography systems can presently be achieved by increasing the e-beam current, but only with an unacceptable degradation in resolution. The degradation of resolution can be attributed to interactions between electrons within the electron beam. The natural repulsion between electrons, due to having charges of the same polarity, causes a number of deleterious effects which limit the resolution at the workpiece 128.

A first effect of electron-electron repulsion is spreading of the distribution of energy within the electron beam, referred to in the art as the Boersch effect. Energy spreading due to electron-electron repulsion exacerbates resolution limitations attributed to chromatic aberrations (e.g. variation in focal point due to variations in the energy of electrons arriving at the focal plane). Another effect is trajectory displacement, that is, the change in the path traveled by an electron due to electron-electron repulsion. Depending on a particular system, one or the other of the Boersch effect or trajectory displacement may be more significant as a limit on the resolution achievable by the system.

SUMMARY OF THE INVENTION

It is an object of the present invention to provide a particle beam imaging system having improved throughput capability.

It is another object of the present invention to provide a method and apparatus for increasing the beam current delivered to a workpiece by a particle beam imaging system, thereby increasing throughput, of an e-beam lithography system, without significantly degrading resolution.

It is another object of the present invention to provide a method and apparatus for enhancing resolution at a given beam current in a particle beam imaging system.

It is a further object still to reduce electron-electron interactions at crossover images in an electron projection system.

The present invention is directed to a particle beam imaging system which includes an illumination subsystem and an imaging subsystem separated by a reticle, the illumination subsystem including a source of charged particles for forming a particle beam, the particle beam forming at least one crossover image in the illumination subsystem. The illumination subsystem further includes a means for increasing the average distance between charged particles in the particle beam at one of the at least one illumination crossover images. In one embodiment the means for increasing the average distance between charged particles in the particle beam includes an annular aperture placed coincident one of the illumination crossover images.

Another aspect of the invention includes a method of operating a particle beam imaging system, the particle beam imaging system including an illumination subsystem and an imaging subsystem separated by a reticle, the illumination subsystem including a source of charged particles for forming a particle beam, the method including the steps of: a) forming a particle beam in the illumination subsystem, the particle beam having a trajectory envelope which includes at least one crossover image in the illumination subsystem; and b) increasing the average distance between charged particles in the particle beam at one of the at least one illumination crossover images.

BRIEF DESCRIPTION OF THE DRAWINGS

The subject matter which is regarded as the invention is particularly pointed out and distinctly claimed in the concluding portion of the specification. The invention, however, may best be understood by reference to the following detailed description of the preferred embodiments and the accompanying drawings in which:

FIG. 2A depicts in schematic form an exemplary improved electron beam projection system having hollow beam illumination (not to scale).

FIG. 2B depicts beam current distributions at various points along the central axis of the system shown in FIG. 2A.

DETAILED DESCRIPTION OF THE PREFERRED EMBODIMENT

Figures 1A, 1B:
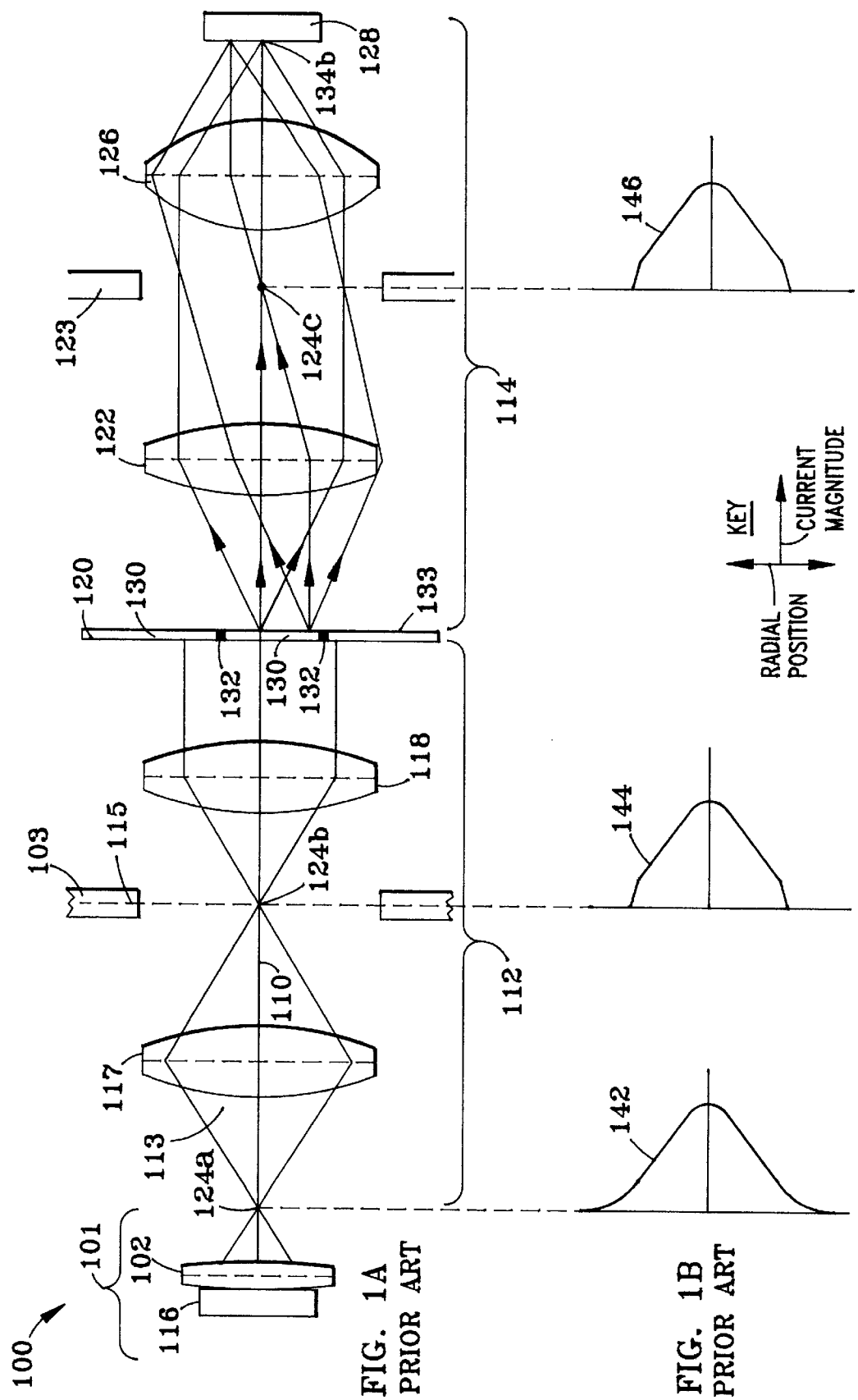
FIG. 1A depicts in schematic form an exemplary conventional electron beam projection system (not to scale).
FIG. 1B depicts beam current distributions at various points along the central axis of the electron beam projection system shown in FIG. 1A.

The present invention involves a method and apparatus for reducing interactions between charged particles in a particle beam imaging system, for example electron-electron interactions in an electron beam projection system, which interactions can contribute to image blurring, or, in other words, degradation of image resolution at the work piece. For purposes of clarity and to avoid prolixity the description of the present invention uses an electron beam system as an example. However, a person of ordinary skill in the art would understand that the invention is not limited to electron beam projection systems, but would encompass any particle beam imaging system.

The solution to the problem of electron-electron interactions, lies in part, in recognizing that not all parts of the beam trajectory between the electron gun and the image at the workpiece contribute equally to image blurring. In an e-beam projection system there are a series of planes within the envelope of electron trajectories in the beam path and normal to the central axis in which the beam cross-sectional area is locally minimal. With reference to FIG. 1, examples of such planes include the planes located by points 124a, 124b and 124c. The image in the planes located by points 124b and 124c are conjugate to the crossover 124a of the electron gun 101. The average distance between electrons is much smaller at crossover images 124b and 124c than at other points along the electron beam. Thus, effects due to electron-electron interactions are much greater at the crossover images 124b and 124c than at other points along the electron beam. Therefore, a significant portion of the overall electron-electron interaction effects arises from the beam path in the vicinity of such crossover images.

With reference to FIG. 2A there is shown in schematic form an exemplary e-beam projection system which embodies the present invention. In FIGS. 1A and 2A like numerals indicate similar features. The system of FIG. 2A includes illumination optics 212 and imaging optics 214 disposed about a central axis 210, and separated by a reticle (e.g. mask) 220 disposed normal to the central axis 210. The illumination optics 212 and imaging optics 214 have functions that are similar to their prior art counterparts discussed above with reference to FIG. 1.

Included within the illumination optics 212 is an electron gun 201 including cathode 216 and associated electrodes 202, condenser 217 and illuminator 218. Interposed between condenser 217 and illuminator 218, at crossover image 224b and normal to the central axis 210, is an aperture 240. The aperture 240 functions to alter the crossover image 224b so as to increase the average distance between electrons at conjugate crossover images, for example, crossover image 224c.

The aperture 240 is preferably annular, having a central circular area which is substantially opaque (non-transmissive) to electrons surrounded by a ring-shaped area which is substantially transparent to electrons and an outer periphery which is substantially opaque to electrons. The transparent portion of the aperture 240 may be in the form of a membrane thin enough to be effectively transparent, and in this case the central opaque portion may be supported by the membrane. Alternatively, the transparent portion may be an open area, in which case the central opaque portion must be supported, for example, by struts extending from the outer opaque portion of the aperture. Methods of fabricating annular apertures having struts are known and will not be discussed in detail herein. The aperture 240 is preferably formed from a refractory metal or from a noble metal having a high melting point, for example platinum, because the power dissipation at the annular aperture may be high.

The annular aperture 240 changes the electron beam from solid to hollow, thereby increasing the average distance between electrons in the electron beam at cross-over image 224b and subsequent conjugate images (e.g. 224c). With reference to FIG. 2B there are shown the beam current distributions (e.g. beam current as a function of radial position from central axis 210) at various points along the central axis 210 of the system 200. Beam current distribution 242 shows a solid beam formed by the electron gun 201 at the gun crossover point 224a which may be an approximately Gaussian distribution. Beam current distribution 242 indicates that the beam current is maximum at the central axis 210 and falls off as radial distance from the axis increases. Therefore the average distance between electrons is smallest near the central axis 210 and increases as the radial distance from the axis increases. Hollow beam current distributions 244 and 246 show the effect on the current distribution of the respective crossover images 224a and 224c when an annular aperture is placed as described above. More particularly, the electrons closest to the central axis at crossover image 224b are not transmitted by the aperture 240, thus increasing average distance between electrons at crossover image 224a and conjugate image 224c.

It should be noted that the annular aperture 240 also has the effect of reducing the overall current of the electron beam, as compared to the solid beam. However, this reduction in beam current should be compensated for by increasing the emission current (e.g. current magnitude exiting the electron gun 201), such that the desired current arrives at the workpiece. For example, if the desired beam current at the workpiece is I and the annular aperture 240 removes 50% of the beam current, the magnitude of the emission current should be 2I. Such compensation maintains the throughput of the system, while simultaneously enhancing resolution. Numerical calculations comparing a conventional electron beam projection system and a system according to the present invention, each having the same beam current incident on the workpiece, show up to approximately a 30% reduction in trajectory displacement aberration of the system according to the present invention over the conventional system.

The preferred placement of the aperture 240 may change depending on the particular characteristics of the overall system 200. For instance, if in a particular system the Boersch effect contributes more to overall aberrations than does trajectory displacement, the aperture 240 is preferably placed at the first crossover image in the illumination optics 212, that is, the crossover image nearest the cathode 216. On the other hand, if for a particular system trajectory displacement is found to be more significant than the Boersch effect, it is sufficient that the aperture 240 be placed at any crossover image in the illumination optics 212 such that the crossover image 224c in the imaging optics 214 is hollow. Moreover, while the envelope of electron trajectories of the exemplary system depicted in FIG. 2 shows parallel illumination of the reticle 220, wherein the crossover image 224c of the imaging optics 212 is at the back focal plane of lens 222, the invention can also be practiced on systems employing non-parallel illumination. In a system employing non-parallel illumination, the crossover image in the imaging optics will appear at a different position. However, the crossover image in the imaging optics will still be hollow if the annular aperture has been properly positioned at a crossover image in the illumination optics as described above.

While the invention has been particularly shown and described with reference to preferred embodiments thereof, it will be understood by those skilled in the art that various other changes in form and detail may be made therein without departing from the spirit and scope of the invention.

What is claimed is:

1. A charged particle beam imaging system comprising an illumination subsystem and an imaging subsystem separated by a reticle, the illumination subsystem including a source of charged particles for forming a charged particle beam, the charged particle beam forming at least one crossover image in the illumination subsystem wherein the illumination subsystem further comprises:

means for increasing the average distance between charged particles in the charged particle beam at the at least one illumination crossover image.

2. The system of claim 1 wherein the means for increasing the average distance between charged particles in the charged particle beam comprises an annular aperture placed at said at least one a crossover image.

3. The system of claim 2 wherein the charged particle beam forms at least two crossover images and the annular aperture is placed at one of the at least two crossover images which is nearest the charged particle source.

4. The system of claim 2 wherein the annular aperture comprises a central circular area which is substantially non-transmissive to the beam of charged particles and a first ring-shaped area which is substantially transmissive to the beam of charged particles, the first ring-shaped area surrounded by a second ring-shaped area which is substantially non-transmissive to the beam of charged particles.

5. The system of claim 4 wherein the annular aperture is formed from a refractory metal.

6. The system of claim 4 wherein the annular aperture is formed from a noble metal.

7. An electron beam imaging system comprising an illumination subsystem and an imaging subsystem separated by a reticle, the illumination subsystem including a source of electrons for forming a electron beam, the electron beam forming at least one crossover image in the illumination subsystem wherein the illumination subsystem further comprises:

means for increasing the average distance between electrons in the electron beam at the at least one illumination crossover image.

8. The system of claim 7 wherein the means for increasing the average distance between electrons in the electron beam comprises an annular aperture placed at said at least one crossover image.

9. The system of claim 8 wherein the electron beam forms at least two crossover images and the annular aperture is placed at one of the at least two crossover images which is nearest the electron source.

10. The system of claim 8 wherein the annular aperture comprises a central circular area which is substantially non-transmissive to the beam of electrons and a first ring-shaped area which is substantially transmissive to the beam of electrons, the first ring-shaped area surrounded by a second ring-shaped area which is substantially non-transmissive to the beam of electrons.

11. The system of claim 10 wherein the annular aperture is formed from a refractory metal.

12. The system of claim 10 wherein the annular aperture is formed from a noble metal.

13. A method of operating a charged particle beam imaging system, the charged particle beam imaging system comprising an illumination subsystem and an imaging subsystem separated by a reticle, the illumination system including a source of charged particles for forming a charged particle beam, comprising the steps of:

forming a charged particle beam in the illumination subsystem, the charged particle beam having a trajectory envelope which includes at least one crossover image in the illumination subsystem; and increasing the average distance between charged particles in the charged particle beam at the at least one illumination crossover image.

14. The method of 13 wherein the step of increasing the average distance between charged particles further comprises the step of positioning an annular aperture at said at least one crossover image.

15. The method of 14 wherein said charged particle beam forms at least two crossover images, and further comprises the step of positioning said annular aperture at one of said at least two crossover images which is nearest the charged particle source.

16. The method of claim 14 wherein the annular aperture comprises a central circular area which is substantially non-transmissive to the beam of charged particles and a first ring-shaped area which is transmissive to the beam of charged particles, the first ring-shaped area surrounded by a second ring-shaped area which is substantially non-transmissive to the beam of charged particles.

17. The method of claim 16 wherein the annular aperture is formed from a refractory metal.

18. The method of claim 16 wherein the annular aperture is formed from a noble metal.

* * * * *